(12) United States Patent
Inoshita et al.

(10) Patent No.: US 7,558,094 B2
(45) Date of Patent: Jul. 7, 2009

(54) CONTROL DEVICE FOR POWER CONVERSION CIRCUIT

(75) Inventors: Ryousuke Inoshita, Aichi-ken (JP); Ken-ichi Ohama, Ichinomiya (JP)

(73) Assignee: DENSO Corporation, Kariya (JP)

( * ) Notice: Subject to any disclaimer, the term of this patent is extended or adjusted under 35 U.S.C. 154(b) by 281 days.

(21) Appl. No.: 11/519,205

(22) Filed: Sep. 12, 2006

(65) Prior Publication Data

US 2007/0058406 A1    Mar. 15, 2007

(30) Foreign Application Priority Data

Sep. 12, 2005   (JP)   ............... 2005-263555

(51) Int. Cl.
*H02M 7/5387*    (2007.01)
*G05F 1/00*    (2006.01)
*H02P 1/18*    (2006.01)

(52) U.S. Cl. .................. 363/132; 323/284; 323/285; 318/254

(58) Field of Classification Search ............ 363/98, 363/132; 318/139, 254, 430, 434, 801; 323/284, 323/285
See application file for complete search history.

(56) References Cited

U.S. PATENT DOCUMENTS

| | | | |
|---|---|---|---|
| 5,798,628 A | | 8/1998 | Fujita et al. |
| 6,060,859 A | * | 5/2000 | Jonokuchi ............ 318/801 |
| 6,590,360 B2 | * | 7/2003 | Hirata et al. ............ 318/727 |
| 6,690,137 B2 | * | 2/2004 | Iwaji et al. ............ 318/700 |
| 6,845,022 B2 | * | 1/2005 | Yoshimura et al. ............ 363/95 |
| RE39,205 E | * | 7/2006 | Sasaki ............ 318/150 |
| 7,199,547 B2 | * | 4/2007 | Kaneko et al. ............ 318/400.08 |

FOREIGN PATENT DOCUMENTS

| | | |
|---|---|---|
| JP | 9-56195 | 2/1997 |
| JP | 2003-204254 | 7/2003 |
| JP | 2004-015910 | 1/2004 |
| JP | 2004-064822 | 2/2004 |
| JP | 2004-096830 | 3/2004 |
| JP | 2004-222420 | 8/2004 |

* cited by examiner

*Primary Examiner*—Jessica Han
*Assistant Examiner*—Emily Pham
(74) *Attorney, Agent, or Firm*—Nixon & Vanderhye P.C.

(57) ABSTRACT

The control device for controlling a power conversion circuit having voltage-controlled type switching elements includes a control unit generating conduction control signals for controlling conduction states of the switching elements in accordance with an external command, and a driver circuit applying a conduction control terminal of each of the switching elements with one of a first voltage having a value to turn on the switching elements and a second voltage having a value to turn off the switching elements in accordance with the conduction control signals. The driver circuit is configured to change at least one of the value of the first voltage and the value of the second voltage so that a voltage difference between the first and second voltages becomes large when the power loss of the switching elements is estimated to exceed a certain value.

11 Claims, 13 Drawing Sheets

CONTROL DEVICE FOR POWER CONVERSION CIRCUIT

CROSS-REFERENCE TO RELATED APPLICATION

This application is related to Japanese Patent Application No. 2005-263555 filed on Sep. 12, 2005, the contents of which are hereby incorporated by reference.

BACKGROUND OF THE INVENTION

1. Field of the Invention

The present invention relates to a control device for controlling an operation of an electric power conversion circuit including voltage-driven type power switching elements whose conduction states are controlled by voltages which the control device applies to their conduction control terminals in order to convert an input voltage into a desired output voltage.

2. Description of Related Art

As such an electric power conversion circuit, there is known an inverter having power switching elements operating to convert an input DC voltage into an AC output voltage to be applied to a three-phase electric motor. It is also known that a control device of the inverter operates to control a voltage applied to each phase of the three-phase motor at a desired value by performing a switching control on the power switching elements of the inverter to control a voltage applied to each phase of the motor, as disclosed in Japanese Patent Applications Laid-open No. 9-56195, and No. 2004-222420.

Generally,. as electric power supplied to the motor increases, that is, as the output power of the inverter increases, a power loss of the power switching elements increases. This may cause the temperature of the switching elements to rise beyond their allowable upper limit.

Accordingly, in view of preventing the temperature of the power switching elements from exceeding their allowable upper limit when they are operating at around their maximum power, it is common to upsize the power switching element. This makes it possible to reduce the amount of heat emitted by the power switching elements, to thereby improve the reliability of the inverter.

As explained above, in using the conventional control device for the power conversion circuit such as and inverter having voltage-driven type power switching elements, the size of the circuit and the amount of the emitted heat are in a tradeoff relationship.

SUMMARY OF THE INVENTION

The present invention provides a control device for controlling a power conversion circuit including voltage-controlled type switching elements, including:

a control unit generating conduction control signals for controlling conduction states of the switching elements in accordance with an external command; and a driver circuit applying a conduction control terminal of each of the switching elements with one of a first voltage having a value to turn on the switching elements and a second voltage having a value to turn off the switching elements in accordance with the conduction control signals;

wherein the control unit includes a first function of estimating whether or not power loss of the switching elements is larger than a certain value on the basis of sensor signals received from external sensors monitoring the power conversion circuit or an electric load supplied with electric power from the power conversion circuit, and the driver circuit is configured to change at least one of the value of the first voltage and the value of the second voltage so that a voltage difference between the first and second voltages becomes large when the first function estimates that the power loss of the switching elements is larger than the certain value.

With the control device of the present invention, since the voltage difference between the gate-application voltage applied to the conduction control terminals of the switching elements of a power conversion circuit to turn on the switching elements and that to turn off the switching elements is increased when the power loss of the switching elements is estimated to exceed a certain value, it becomes possible to reduce the power loss of the power conversion circuit such as an inverter without upsizing the switching elements.

The driver circuit may be configured to increase an absolute value of the first voltage when the first function estimates that the power loss of the switching elements is larger than the certain value.

The control unit may further include a second function of estimating which of conduction loss and switching loss is a main cause of the power loss of the switching elements on the basis of the sensor signals, and the driver circuit may be configured to increase an absolute value of the first voltage when the second function estimates that conduction loss is a main cause of the power loss, and to increase an absolute value of a difference between said first voltage and said second voltage when the second function estimates that switching loss is a main cause of the power loss.

The control unit may be configured to cause the driver circuit to increase an absolute value of the first voltage when output power of the power conversion circuit is larger than a certain value.

The sensor signals may include at least one of a signal indicative of an output current of the power conversion circuit, a signal indicative of an output voltage of the power conversion circuit, and signals designating timings to turn on or off the switching elements.

When the electric load is a multiphase motor, the first function may be configured to estimate that power loss of the switching elements is larger than the certain value when an output power of the multiphase motor is larger than a certain value.

When the electric load is a multiphase motor, the sensor signals may include at least one of a signal indicative of a voltage applied to the multiphase motor, a signal indicative of a current flowing into the multiphase motor, a signal indicative of a command voltage to be applied to the multiphase motor, a signal indicative of a command current to be flown into the multiphase motor, a rotational speed of the multiphase motor, and an output torque of the multiphase motor.

When the electric load is a three-phase motor, the control unit may be configured to generate the conduction control signals for controlling conduction states of the switching elements on the basis of a difference between a dq-transformed command current and a dq-transformed active current of the three-phase motor, and the sensor signals may include at least one of dq-transformed currents on d- and q-axes, or a dq-transformed voltage on d-and q-axes of the three-phase motor.

The control unit may include a map defining a relationship between one of the first and second voltages and the difference between the dq-transformed command current and the dq-transformed active current of the three-phase motor.

Other advantages and features of the invention will become apparent from the following description including the drawings and claims.

BRIEF DESCRIPTION OF THE DRAWINGS

In the accompanying drawings.

PREFERRED EMBODIMENTS OF THE INVENTION

First Embodiment

Figure 1:
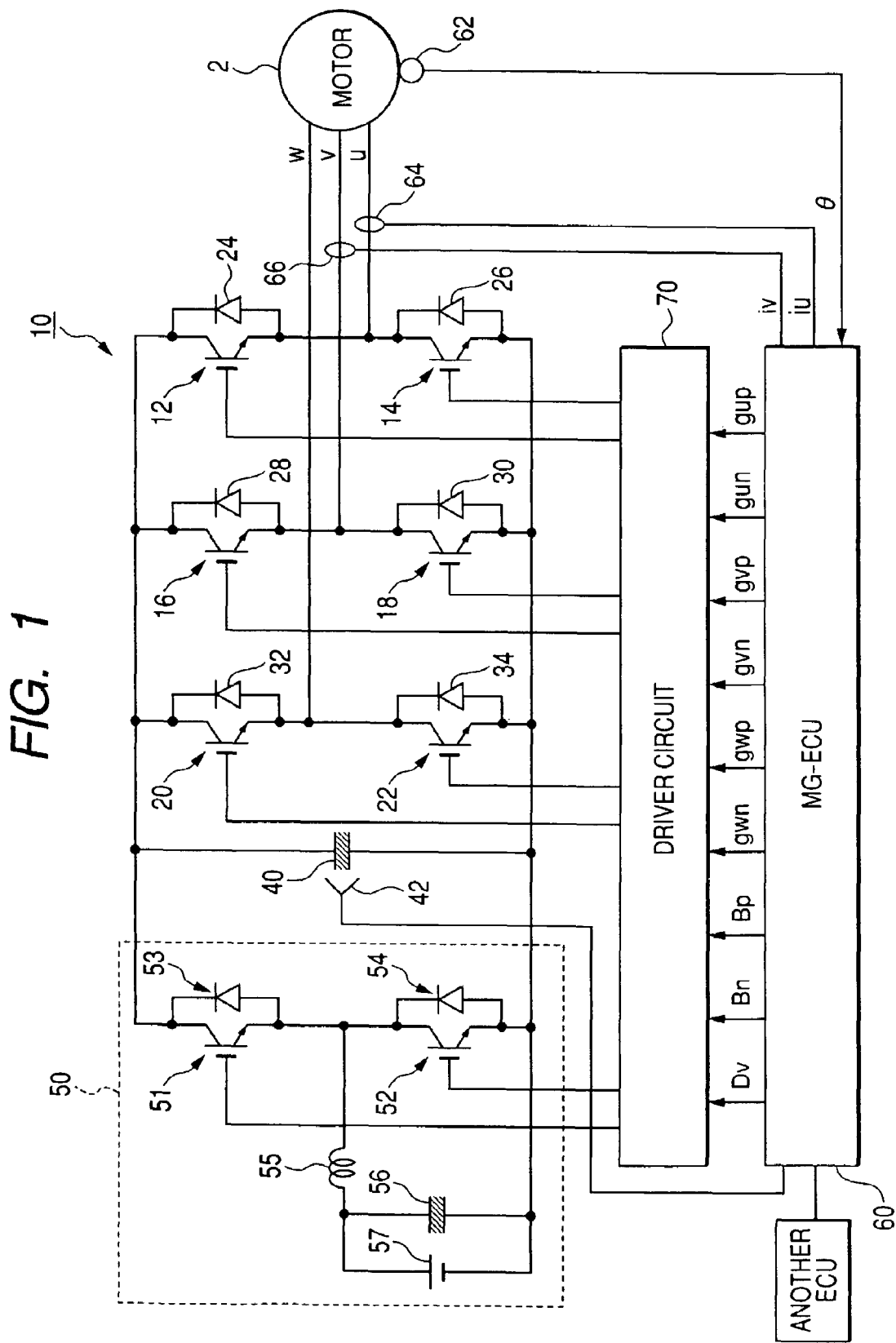
FIG. 1 is a circuit diagram showing a structure of a three-phase inverter as a power conversion circuit for driving a motor mounted on a hybrid vehicle, and a structure of a control device according to a first embodiment of the invention.

FIG. 1 is a circuit diagram showing a structure of a three-phase inverter 10 as a power conversion circuit for use in a hybrid vehicle, and a structure of a control device according to a first embodiment of the invention.

As shown in this figure, the inverter 10 is connected to three phases (U-phase, V-phase, and W-phase) of a three-phase motor 2 mounted on the vehicle. The inverter 10 includes a parallel combination of a series of switching elements 12, 14, a series of switching elements 16, 18, and a series of switching elements 20, 22 corresponding to the three phases of the motor 2. The inverter 10 further includes diodes 24-34 respectively parallel-connected to the switching elements 12-22. A node between the switching element 12 and the switching element 14 is connected to the U-phase of the motor 2. A node between the switching element 16 and the switching element 18 is connected to the V-phase of the motor 2. A node between the switching element 20 and the switching element 22 is connected to the W-phase of the motor 2. Each of the switching elements 12-22 is an IGBT (Insulated Gate Bipolar Transistor).

Each of the series of the switching elements 12, 14, the switching elements 16, 18, and the switching elements 20, 22 is applied with an output voltage of a main power source 50 through a capacitor 40. The main power source 50 has a series of switching elements 51, 52 parallel-connected across the terminals of the capacitor 40. Diodes 53, 54 are respectively parallel-connected to the switching elements 51, 52. A series of a capacitor 55 and a capacitor 56 is parallel-connected across the terminals of the switching element 52. A battery 57 is parallel-connected across the terminals of the capacitor 56.

The control device is constituted by an MG-ECU (Motor Generator Electronic Control Unit) 60 and a driver circuit 70. The MG-ECU 60 reads detection results of a position sensor 62 detecting a rotation angle of an output shaft of the motor 2, current sensors 64, 66 respectively detecting currents flowing into the U-phase and V-phase, a voltage sensor 42 detecting a voltage across the terminals of the capacitor 40, etc. The MG-ECU 60 calculates a current flowing into the W-phase on the basis of the currents flowing into the U-phase and the V-phase in accordance with the Kirchhoff's law. The MG-ECU 60 performs a switching control on the switching elements 12-22 by way of the driver circuit 70 depending on the rotation angle of the output shaft of the motor 2 and the currents flowing into the U-, V-, and W-phases.

Figure 2:
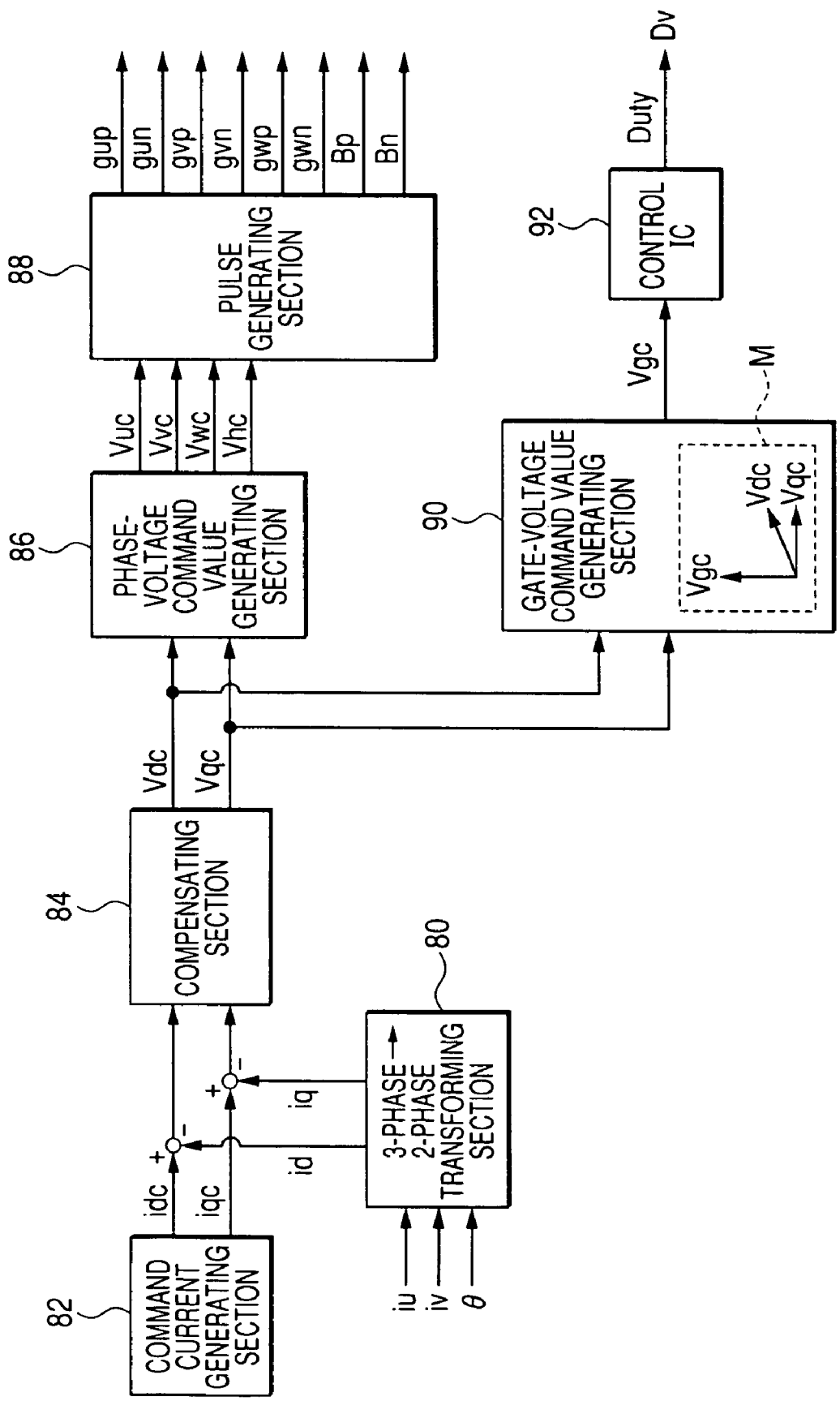
FIG. 2 is a block diagram showing a structure of an MG-ECU (motor generator electronic control unit) included in the control device of the first embodiment.

FIG. 2 is a block diagram of the MG-ECU 60. As shown in this figure, the MG-ECU 60 includes a coordinate transforming section 80, a command current generating section 82, a compensating section 84, a phase-voltage command value generating section 86, a pulse generating section 88, a gate-voltage command value generating section 90, and a control IC 92.

The coordinate transforming section 80 calculates active currents iu, iv, iw respectively flowing into the U-, V-, and W-phases of the motor 2 on the basis of the detection results of the current sensors 64, 66, in order to determine an active current id and an active current iq through the dq-axis transformation which is well known in the art as a coordinate transformation method. Since this coordinate transformation method uses rotation angle of a rotor of the motor 2, a signal indicative of the rotation angle θ of the output shaft of the motor 2 outputted from the position sensor 52 is supplied to the coordinate transforming section 80. The command current generating section 82 generates a command current iqc and a command current idc each of which has a value depending on the rotation angle θ and acceleration requirement (depressed amount of a gas pedal of the vehicle, for example).

The compensating section 84 calculates a command voltage Vdc on the d-axis, and a command voltage Vqc on the q-axis on the basis of the difference between the command current idc and the active current id, and the difference between the command current iqc and the active current iq. The phase-voltage command value generating section 86 generates a command voltage Vuc for the U-phase, a command voltage Vvc for the V-phase, a command voltage Vwc for the W-phase, and a command voltage Vhc to be applied across the terminals of the capacitor 40. The pulse generating section 88 generates control signals used for controlling the switching elements 12-22, and the switching elements 51-52 To be more precise, the pulse generating section 88 generates control signals gup, gun used for on/off-controlling the switching elements 12, 14 for the U-phase, control signals gvp, gvn used for on/off-controlling the switching elements 16, 18 for the V-phase, control signals gwp, gwn used for on/off-controlling the switching elements 20, 22 for the W-phase, and control signals Bp, Bn used for on/off-controlling the switching elements 51, 52 of the main power source 50.

The gate-voltage command value generating section 90 receives the command voltages Vdc, Vqc from the compensating section 84, and generates a command application-voltage Vgc indicative of a value of a voltage to be applied to the gates (conduction control terminals) of the switching elements 12-22. The control IC 92 generates a control signal Dv having a duty ratio depending on the command application-voltage Vgc.

Figure 3:
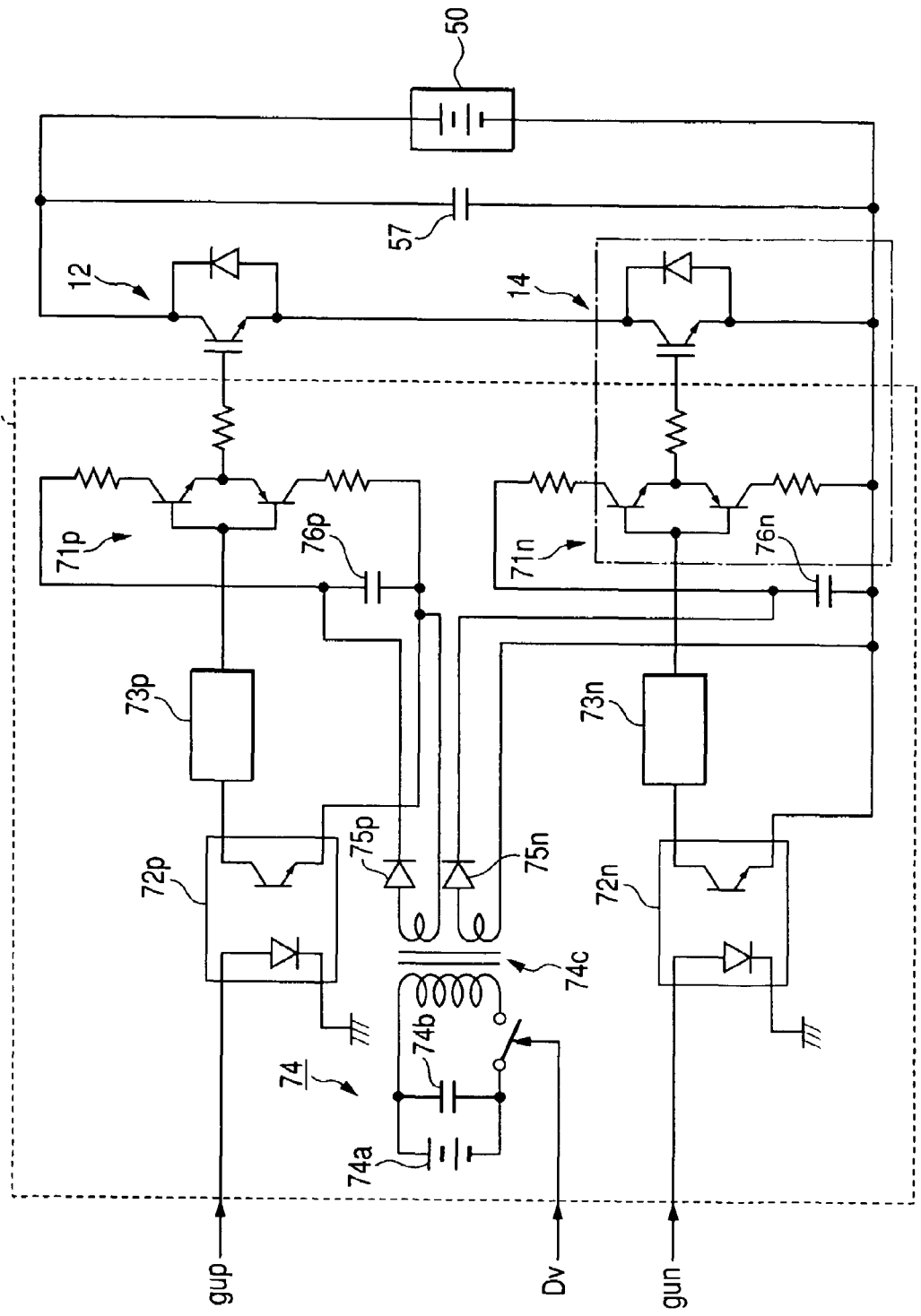
FIG. 3 is a circuit diagram of a driver circuit included in the control device of the first embodiment.

FIG. 3 is a circuit diagram of the drive circuit 70. In this circuit diagram, only a part for driving the switching elements 12, 14 is shown for the sake of simplicity The drive circuit 70 includes drivers 71p, 71n applying voltages to the gates of the switching elements 12, 14. The drivers 71p, 71n are controlled by the control signals gup, gun. To be more precise, the drivers 71p, 71n are on/off-controlled by the control signals gup, gun having been power-converted by photocouplers 72p, 72n, and driver ICs 73p, 73n. A voltage transforming circuit 74, which is for generating a voltage to be applied to the gates of the switching elements 12, 14, includes a driving power source 74a, a transformer 74c connected across the terminals of the driving power source 74a through a switch 74d, and a capacitor 74b connected across the terminals of the driving power source 74a. The output of the voltage transforming circuit 74 (the voltage across a secondary coil of the transformer 74c) is applied across capacitors 76p, 76n respectively parallel-connected to the drivers 71p, 71n through diodes 75p, 75m.

The conduction of the switch 74d is controlled in accordance with the level of the control signal Dv outputted from the control IC 92, so that the output of the voltage transforming circuit 74 is adjusted depending on the duty ratio of the control signal Dv. This makes it possible to control the voltages outputted from the drivers 71p, 71n, and accordingly to control the voltages applied to the gates of the switching elements 12, 14 in accordance with the duty ratio of the control signal Dv.

Although not shown in FIG. 3, the driver circuit 70 includes the same circuit elements as described above for controlling the voltages applied to the gates of the switching elements 16, 18, and the switching elements 20, 22 in accordance with the duty ratio of the control signal Dv. Also, the driver circuit 70 includes circuit elements for power-converting the control signals Bp, Bn, and applies them to the gates of the switching elements 51, 52.

The driver circuit 70 having the above described structure makes it possible to variably sets the voltages applied to the gates of the switching elements 12-22. Next, it is explained in detail how the gate voltages are variably set.

When the inverter 10 is downsized, heat emitted from the switching elements 12-22 matters. This heat emission is caused mainly by a heat loss of. the switching elements 12-22. This heat loss results mainly from a conduction loss in a current path from a collector to an emitter of each switching element when it is in an on state, and from a switching loss of each switching element.

Figure 4:
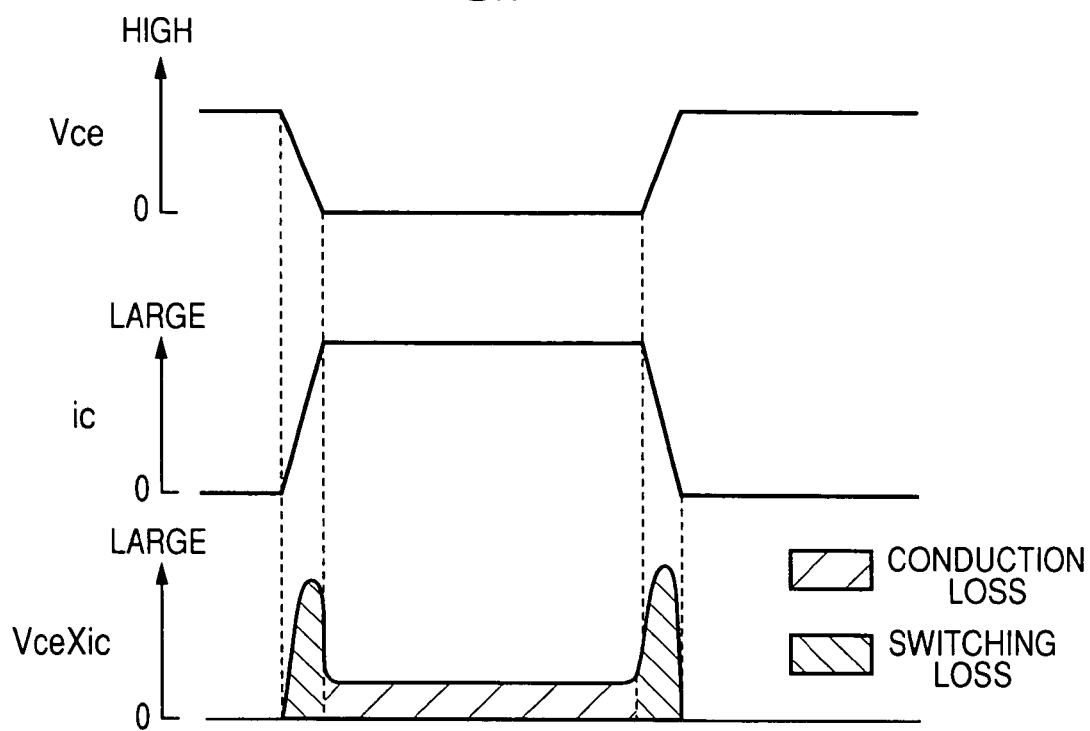
FIG. 4 is a diagram showing temporal changes of Vce (a voltage between an emitter and a collector of a switching element included in the inverter), ic (a collector current), and a power loss represented by a product of the Vce and the ic.

FIG. 4 is a diagram showing temporal changes of Vce (a voltage between an emitter and a collector of each switching element), ic (a collector current), and a power loss represented by a product of the voltage Vce and the current ic.

Figure 5:
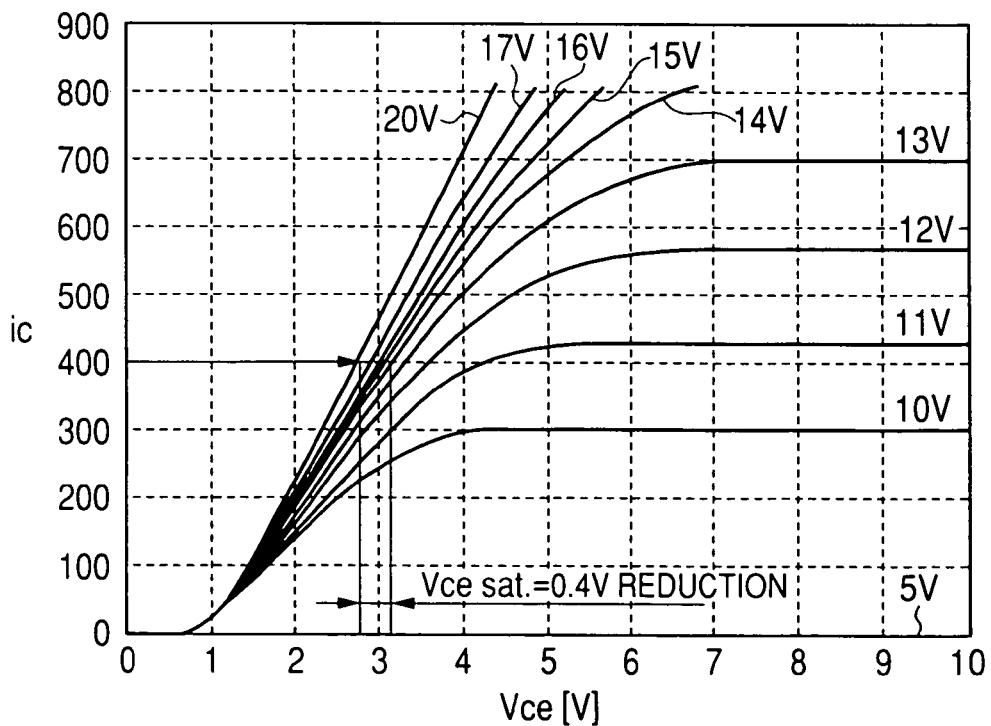
FIG. 5 is a graph showing how Vce-ic characteristic varies when a voltage applied to a gate of an IGBT as a switching element having a threshold voltage of 5.8V is varied in a range from 5 V to 20 V.

FIG. 5 is a graph showing how Vce-ic characteristic varies when a voltage applied to a gate of an IGBT as a switching element having a threshold voltage of 5.8 V is varied in a range from 5 V to 20 V. As seen from this graph, as the voltage applied to the gate to turn on the switching element (may be referred to as "gate-application voltage" hereinafter) increases, Vce decreases if ic is constant. Accordingly, by increasing the gate-application voltage, the conduction loss can be reduced. For example, when ic is 400 A, by increasing the gate-application voltage from 15 V to 20 V, Vce can be reduced by 0.4 V.

In addition, increasing the gate-application voltage makes it possible to reduce also the switching loss. The reason for that is explained below.

Figure 6:
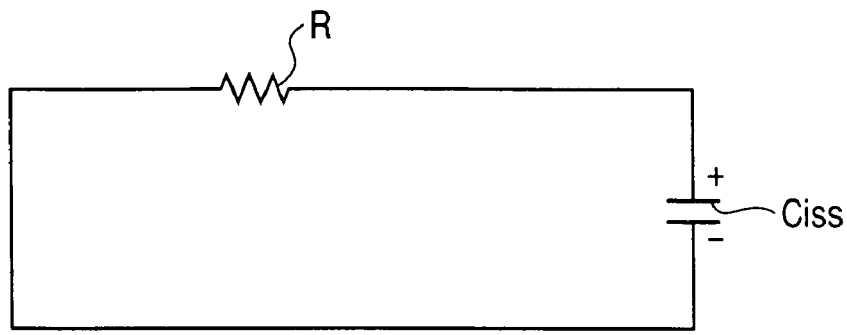
FIG. 6 is an equivalent circuit of a part surrounded by a dashed line in FIG. 3 immediately after the switching element has changed from the on state to the off state.

FIG. 6 is an equivalent circuit of a part surrounded by a chain line in FIG. 3 immediately after the switching element 14 has changed from the on state to the off state. As shown in this figure, this equivalent circuit is a closed loop of a series of a capacitor Ciss and a resistor R. The terminals of the capacitor Ciss correspond to the gate and the emitter of the switching element 14. The voltage Vciss across the terminals of the capacitor Ciss is given by the following expression.

$$V\text{ciss}(t) = Vi \times \exp(-t/(R \times C\text{iss}))$$

where Vi is an initial value which is a difference between the voltage across these terminals when the switching element is in the on state and that when the switching element is in the off state.

As understood from this expression, the lowering rate of the voltage Vciss (the voltage between the gate and the emitter) increase as the voltage difference (initial value) increases. That is, the switching loss reduces as the voltage difference (initial value) increases.

From the above explanation, it is evident that the switching loss of the switching elements 12-22 can be reduced by increasing the gate-application voltage. However, there is a fear that increasing the gate-application voltage promotes deterioration of the switching elements 12-22.

Accordingly, in this embodiment, the gate-application voltage is increased by an amount depending on the amount of heat emitted from the inverter 10 in order to satisfy both the requirement of reduction of heat emitted from the inverter 10, and the requirement of suppression of the deterioration of the switching elements 12-22.

The main object of the present embodiment is to suppress the temperature rise of the inverter 10, that is, to suppress the amount of heat emitted from the switching elements 12-22 per unit time.

Figure 7A:
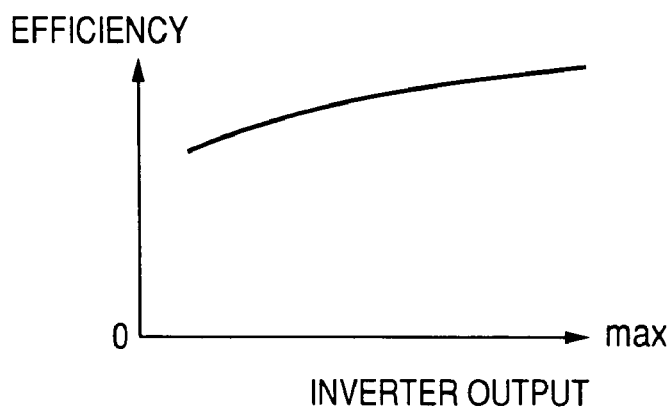
FIG. 7A is a graph showing a relationship between the output power of the inverter shown in FIG. 1 and the power conversion efficiency of this inverter.
Figure 7B:
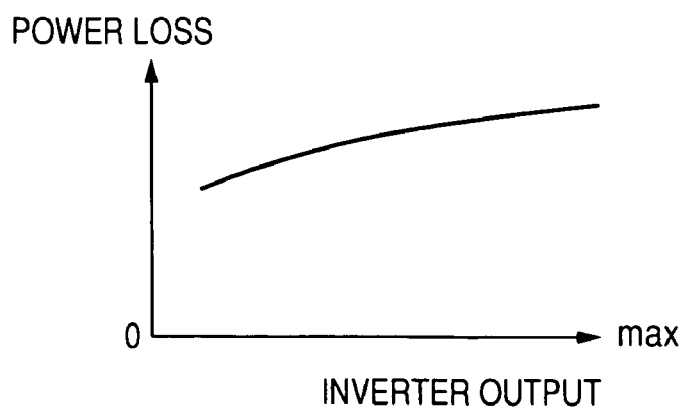
FIG. 7B is a graph showing a relationship between a power loss of the inverter show in FIG. 1 and an output power of this inverter.

FIG. 7A is a graph showing a relationship between the output power of the inverter 10 and the power conversion efficiency of the inverter 10 (the ratio between the input power and the output power). Generally, the power conversion efficiency of the inverter 10 increases with the increase of its output power, because of the nonlinear characteristics of the switching elements 12-22. However, as shown in FIG. 7B, the power loss of the inverter 10 increases with the increase of its output power if the switching frequency is constant.

Accordingly, the matter of the power loss of the inverter 10 becomes crucial when the input and output powers of the inverter 10 are large, or when the input and output voltages of the inverter 10 are large. Hence, in this embodiment, the gate-application voltage is increased when the output power of the inverter 10 is large as explained below with reference to FIG. 8.

Figure 8:
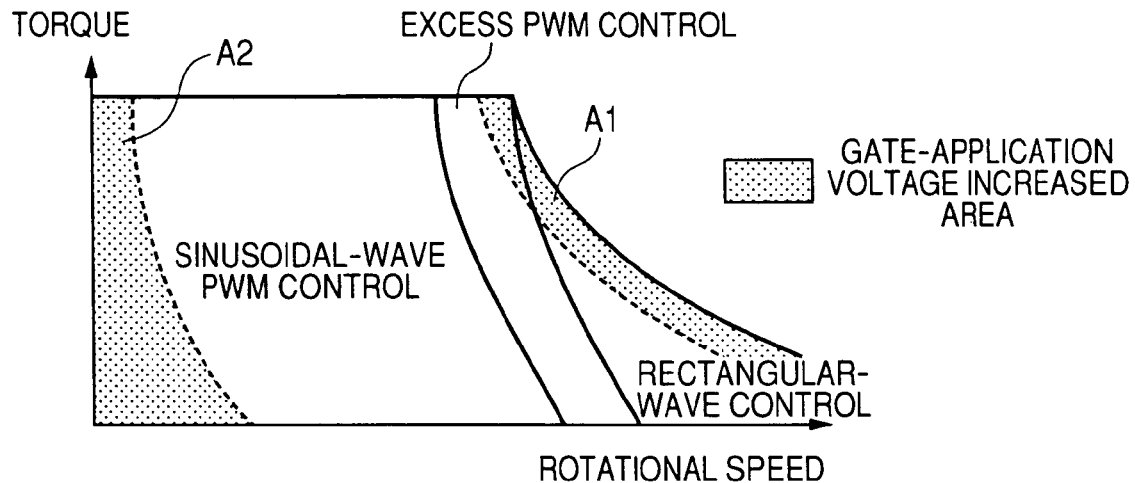
FIG. 8 is a diagram showing how the switching elements included in the inverter circuit shown in FIG. 1 are controlled depending on the output torque and the rotational speed of the motor shown in FIG. 1.

FIG. 8 is a diagram showing how the switching elements 12-22 are controlled depending on the output torque and the rotational speed of the motor 2. As shown in this figure, in an area where the rotational speed is relatively small, the switching elements 12-22 are subjected to a well-known sinusoidal-wave PWM control in order to apply a sinusoidal wave voltage to each phase of the motor 2. In an area where the rotational speed is relatively large, the switching elements 12-22 are subjected to an excess PWM control. When the rotational speed of the motor 2 further increases, the switching elements 12-22 are subjected to a rectangular-wave field weakening control in order to apply a rectangular-wave voltage to each phase of the motor 2. For details of these controls, refer to "Nikkei monozukuri 2004, August issue".

In this embodiment, the gate-application voltage is increased in a shaded area A1 shown in FIG. 8, where both the output torque and the rotational speed of the motor 2 are large, and accordingly the output power of the inverter 10 is around its maximum, and also in a shaded are A2 (to be explained later).

Incidentally, the input power of the motor 2 (or the output power of the inverter 10) is equal to "the output power of the motor 2+the copper loss of the motor 2+the iron loss of the motor 2+the mechanical loss of the motor 2". It should be noted that the output power of the inverter 10 increases with the increase of the rotational speed of the motor 2, because the back electromotive force of the motor 2 increases with its rotational speed.

Figure 9:
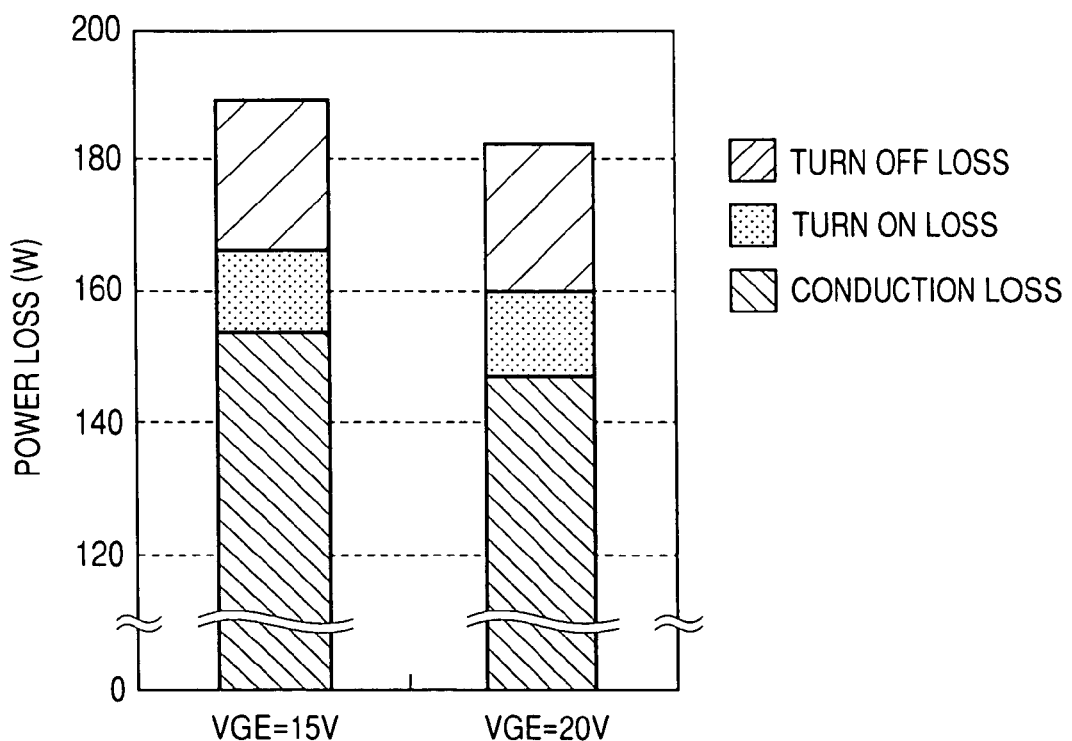
FIG. 9 is a graph showing how the power loss of the inverter shown in FIG. 1 is reduced when a gate-application voltage applied to the gate of the switching elements is increased from 15 V to 20 V.

FIG. 9 is a graph showing how the power loss is reduced when the gate-application voltage is increased from 15 V to 20 V, in a case where the switching frequency is 1.25 kHz, and the motor current is 190 A rms.

In this embodiment, since the switching frequency is increased when the output power of the motor 2 is around its minimum, the gate-application voltage is increased also in the shaded area A2 shown in FIG. 8 in order to reduce the switching loss.

In this embodiment, the gate-voltage command value generating section 90 is provided with a map M defining the relationship between the command application-voltage Vgc and the command voltages Vdc, Vqc, so that it can recognize the areas where the gate-application voltage should be increased.

The above described embodiment offers the following advantages.

(1) The gate-application voltage is increased when the power loss of the inverter 10 is estimated to exceed a certain value, in order to reduce the conduction loss and the switching loss of the switching elements 12-22. This makes it possible to reduce the power loss of the inverter 10 without upsizing the inverter 10.

(2) The gate-voltage command value generating section 90 is provided with the map M defining the relationship between the command application-voltage Vgc and the command voltages Vdc, Vqc. This makes it possible to reduce the calculation load of the MG-ECU 60.

Second Embodiment

Next, a control device according to a second embodiment of the invention is explained. The second embodiment differs from the first embodiment in the structure of the driver circuit 70.

Figure 10:
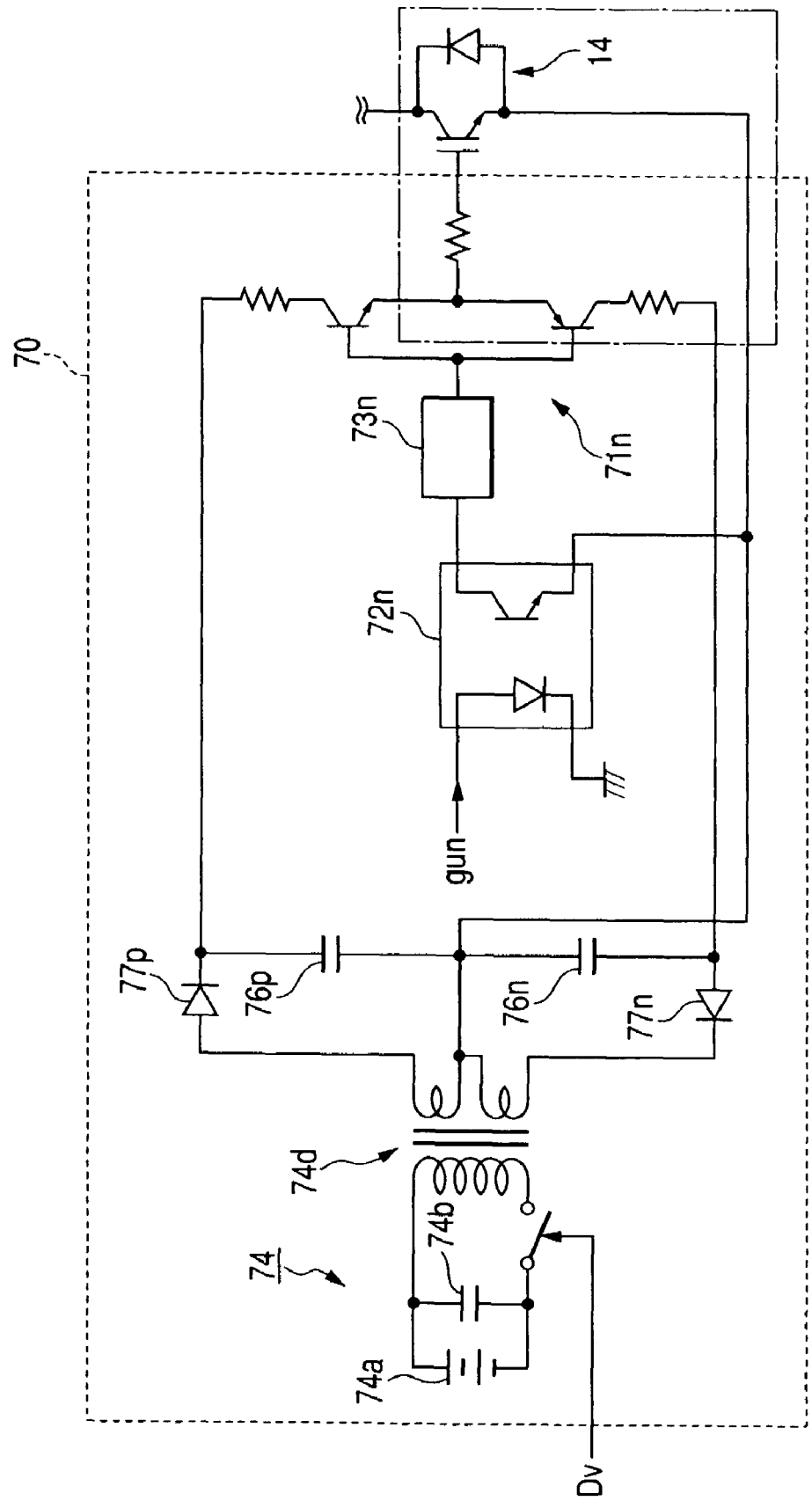
FIG. 10 is a circuit diagram of a driver circuit included in a control device according to a second embodiment of the invention.

FIG. 10 is a circuit diagram of the driver circuit 70 of the control device of the second embodiment. In this circuit diagram, only a part for driving the switching element 14 is shown for the sake of simplicity. In FIG. 10, the reference characters identical to those in FIG. 3 designate elements equivalent to those in the first embodiment.

As shown in this figure, a series of a positive power source capacitor 76p and a negative power source capacitor 76n is connected across the terminals of the driver 71n. A transformer 74d of the voltage transforming circuit 74 has a series of two secondary coils A node between them is connected to a node between the positive power source capacitor 76p and the negative power source capacitor 76n, connected to a low-voltage side terminal of the photocoupler 72n, and to the emitter of the switching element 14. A high-voltage side output of the series of the secondary coils is applied to a high-voltage side terminal of the positive power source capacitor 76p through a diode 77p. A low-voltage side output of the series of the secondary coils is applied to a low-voltage side terminal of the negative power source capacitor 76n.

With such a structure, the gate-application voltage, that is, the voltage applied between the emitter and the gate to turn on the switching element 14 can be positive, and that to turn off the switching element 14 can be negative. In addition, the ratio between the absolute values of the gate-application voltage to turn on the switching element 14 and that to turn off the switching element 14 can be easily adjusted by adjusting the winding number ratio between the primary and secondary coils.

Figure 11:
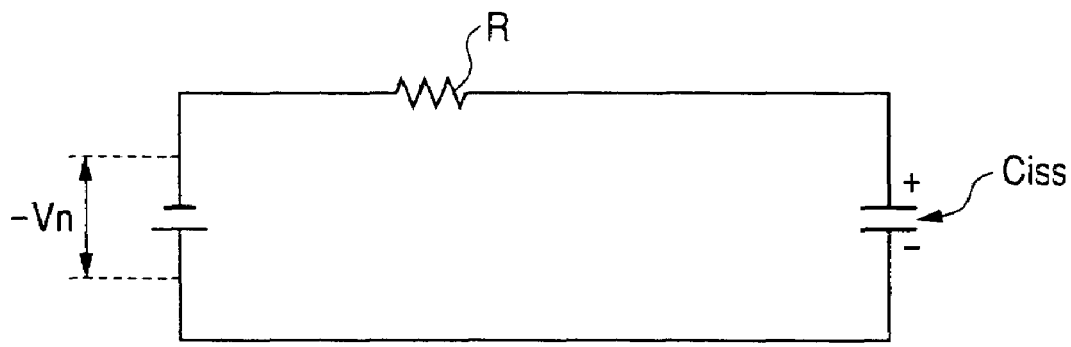
FIG. 11 is an equivalent circuit of a part surrounded by a dashed line in FIG. 10 immediately after the switching elements has changed from the on state to the off state.

FIG. 11 is an equivalent circuit of a part surrounded by a chain line in FIG. 10 immediately after the switching element 14 has changed from the on state to the off state.

As shown in this figure, this equivalent circuit is a closed loop of a series of a capacitor Ciss, a resistor R, and a negative power source outputting a negative voltage of −Vn. The terminals of the capacitor Ciss correspond to the gate and the emiter of the switching element 14. The voltage Vciss across the terminals of the capacitor Ciss is given by the following expression.

$$V\text{ciss}(t) = -Vn + Vi \times \exp(-t/(R \times C\text{iss}))$$

where Vi is an initial value which is a difference between the voltage across these terminals when the switching element is in the on state and that when the switching element is in the off state.

As understood from this expression, the lowering rate of the voltage Vciss (the voltage between the gate and the emitter) increase as the voltage difference (initial value) increases. According to this embodiment, it is possible to set the initial value Vi at a large value, because the sign of the gate-application voltage to turn on the switching element 14 is opposite to that to turn off the switching element 14.

Figure 12:
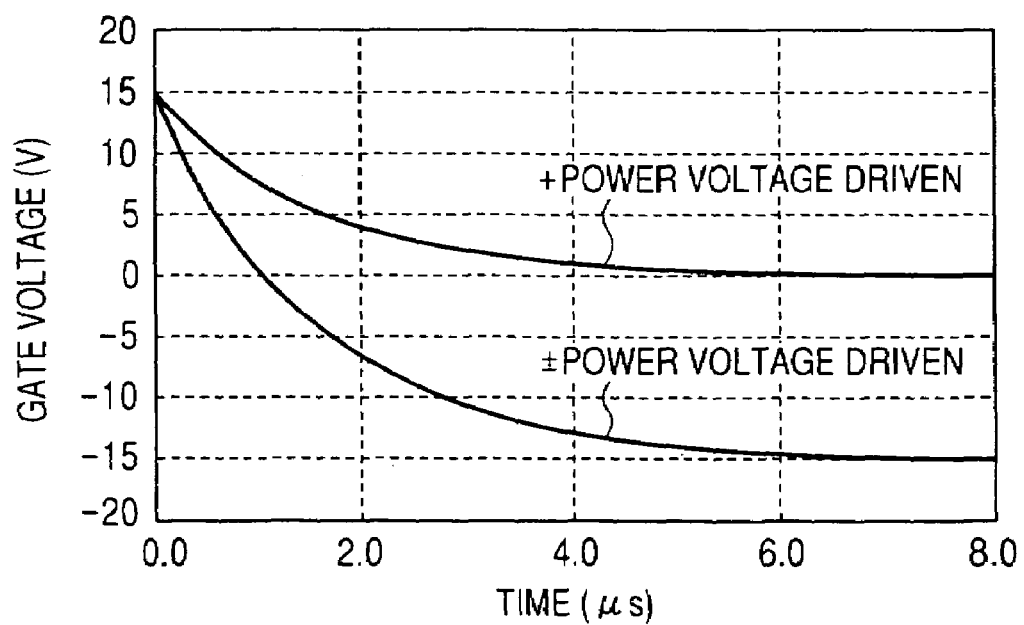
FIG. 12 is a graph showing how the voltage of the gate of the switching element shown in FIG. 10 decreases for each of a case where the gate-application voltage is changed from +15V to 0 V, and a case where the gate-application voltage is changed from +15V to −15 V.

FIG. 12 is a graph showing how the voltage of the gate of the switching element 14 decreases for each of a case where the gate-application voltage is changed from +15 V to 0 V, and a case where the gate-application voltage is changed from +15 V to −15 V. As seen from this graph, the decreasing rate of the gate voltage in the case where the gate-application voltage is changed from +15 V to −15 V is large compared to the case where the gate-application voltage is changed from +15 V to 0 V. Accordingly, according to the second embodiment, the switching speed of the switching elements can be increased.

Figure 13:
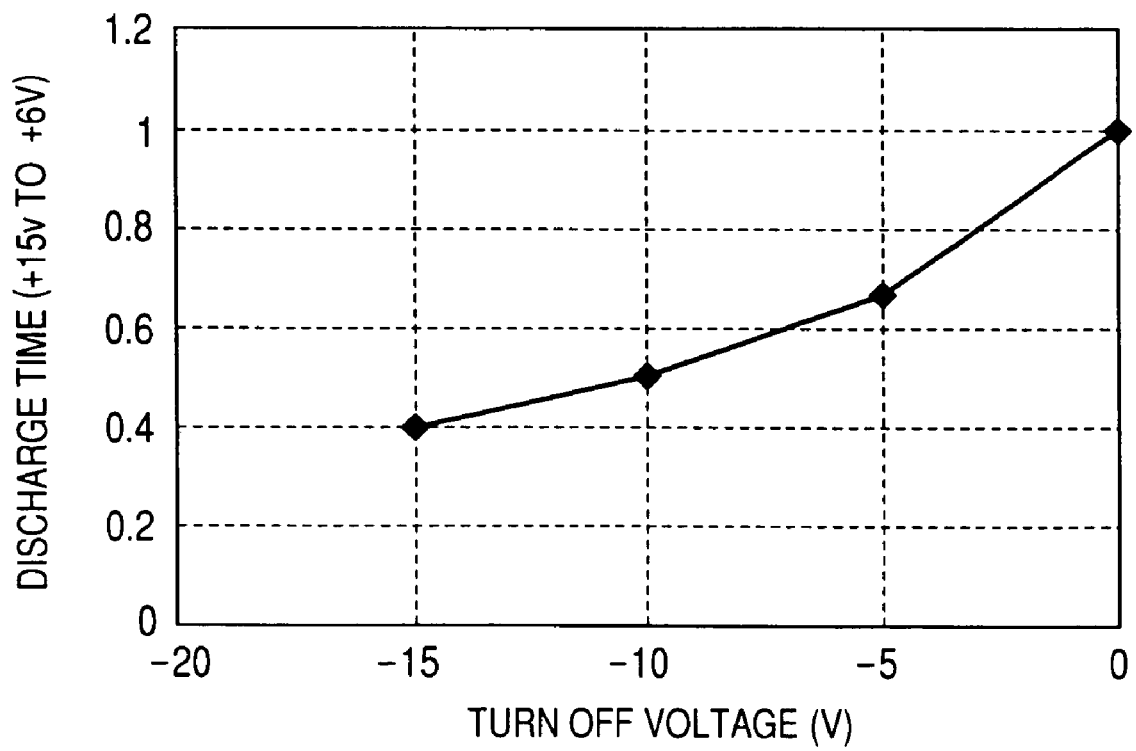
FIG. 13 is a graph showing how the time needed for the voltage of the gate of the switching element shown in FIG. 10 to decrease from +15 V to +6V as a function of the gate-application voltage applied to the gate to turn off the switching element.

FIG. 13 is a graph showing how the discharge time (the time needed for the voltage of the gate of the switching element 14 to decrease from +15 V to +6 V) varies as a function of the gate-application voltage applied to the gate to turn off the switching element 14. As seen from this graph, by increasing in absolute value the gate-application voltage to turn off the switching element 14, that is, by increasing the difference between the gate-application voltage to turn on the switching element 14 and that to turn off the switching element 14, the decreasing rate of the voltage of the gate of the switching element 14 can be increased.

The second embodiment offers the following advantage in addition to the advantages (1) and (2) enumerated in the first embodiment.

(3) By inverting the sign of the gate-application voltage to change the switching element between the on state and the off state, the switching loss can be further reduced, because the difference between the voltage of the gate of the switching element when it is in the on state and that when it is in the off state can be increased.

Third Embodiment

Next, a control device according to a third embodiment of the invention is explained. The third embodiment differs from the second embodiment in the structure of the driver circuit 70.

Figure 14:
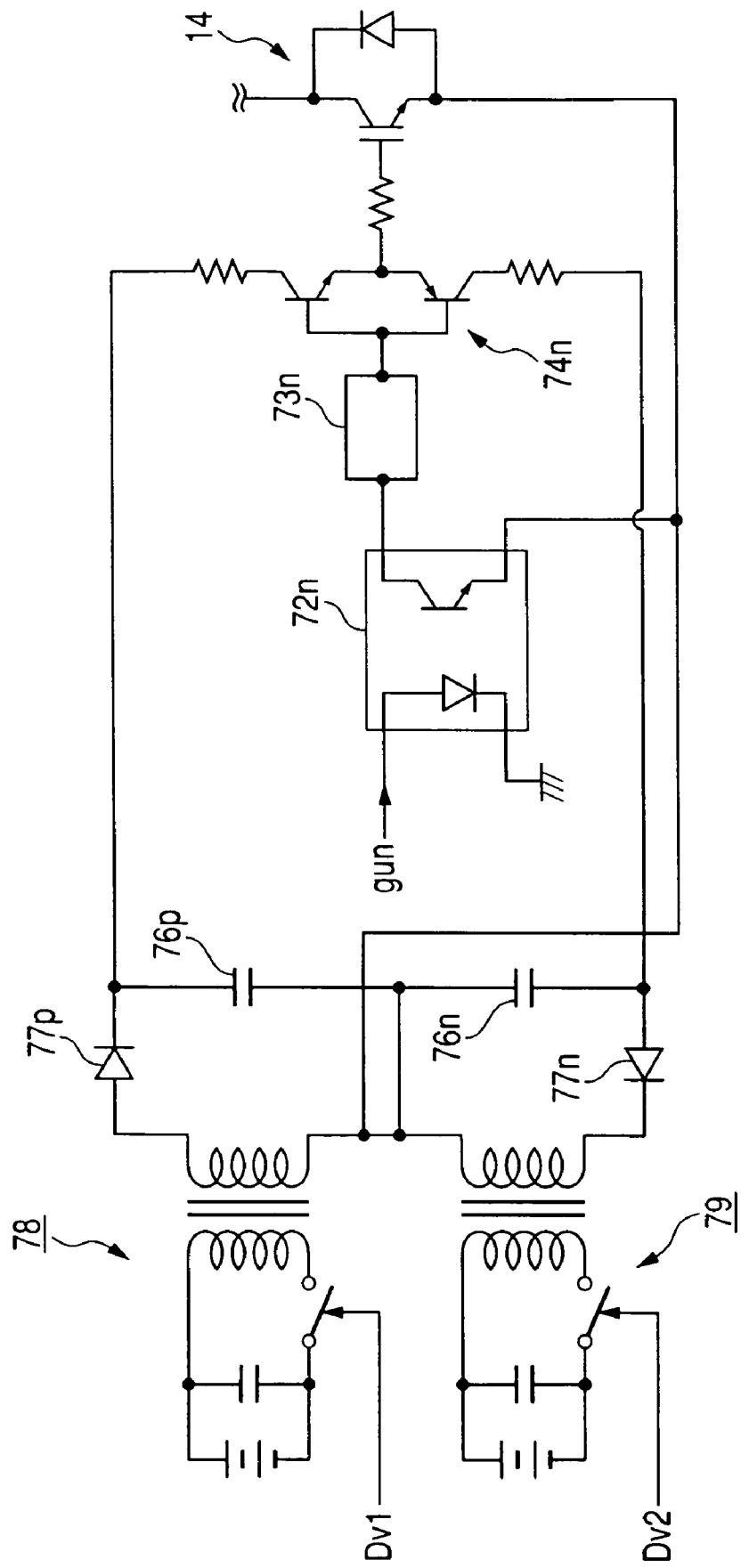
FIG. 14 is a circuit diagram of a driver circuit included in a control device according to a third embodiment of the invention.

FIG. 14 is a circuit diagram of the driver circuit 70 of the control device of the third embodiment. In this circuit diagram, only a part for driving the switching element 14 is shown for the sake of simplicity. In FIG. 14, the reference characters identical to those in FIG. 10 designate elements equivalent to those in the second embodiment.

In this embodiment, the driver circuit 70 includes a voltage transforming circuit 78 for generating a positive gate-application voltage and a voltage transforming circuit 79 for generating a negative gate-application voltage. The terminals of a secondary coil of the voltage transforming circuit 78 are connected across the terminals of the positive power source capacitor 76p, and the terminals of a secondary coil of the voltage transforming circuit 79 are connected across the terminals of the negative power source capacitor 76n. Although the voltage transforming circuit 74 in the first and second embodiments is supplied with the control signal Dv, the voltage transforming circuit 78 is supplied with a control signal Dv1, and the voltage transforming circuit 79 is supplied with a control signal Dv2.

Figure 15:
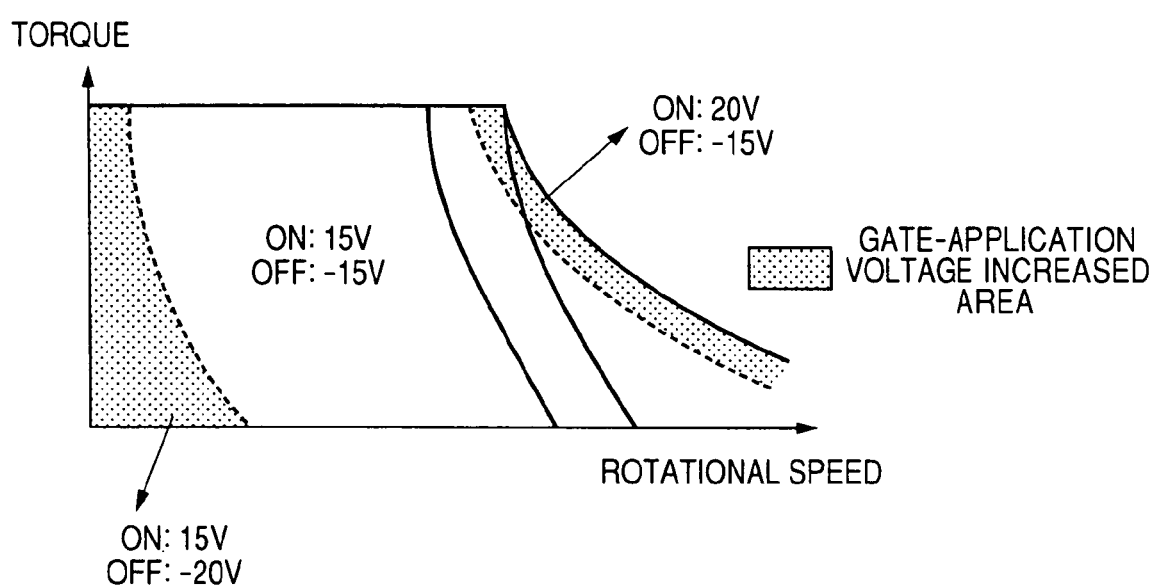
FIG. 15 is a diagram showing how the switching element shown in FIG. 14 is controlled depending on the output torque and the rotational speed of the motor.

The above described structure of the driver circuit 70 of the third embodiment makes it possible to change the ratio between the absolute value of the gate-application voltage to turn on the switching elements and that to turn off the switching elements depending on which of the conduction loss and switching loss is more dominant, as described below. In this embodiment, as shown in FIG. 15, the gate-application voltage to turn on the switching element is set at +15V, and that to turn off the switching element is set at −15 V for all areas other than the areas A1, A2 where the gate-application voltage should be increased. Of the areas A1, A2 where the gate-application voltage should be increased, in the area A1 where the motor 2 is in a high output power state, the gate-application voltage to turn on the switching element is set at +20 V, and that to turn off the switching element is set at −15 V, because the conduction loss is dominant in this area A1. On the other hand, in the area A2 where the motor 2 is in a low output power state, the gate-application voltage to turn on the switching element is set at +15 V, and that to turn off the switching element is set at −20 V, because the switching loss is dominant in this area A2.

The third embodiment offers the following advantage in addition to the advantages (1), (2) enumerated in the first embodiment and the advantage (3) enumerated in the second embodiment.

(4) When the conduction loss of the switching elements 12-22 is large, the gate-application voltage to turn on the switching elements is increased, and when the switching loss of the switching elements 12-22 is large, the difference between the gate-application voltage to turn on the switching elements 12-22 and the gate-application voltage to turn off the switching elements 12-22 is increased. As a result, it becomes possible to more appropriately control the gate-application voltage depending on which of the conduction loss and the switching loss is the main cause of the power loss of the inverter 10.

Fourth Embodiment

Next, a control device according to a fourth embodiment of the invention is explained.

The fourth embodiment differs from the first embodiment in that the gate-application voltage is variably set depending on the current flowing into the motor 2, and the rotational speed of the motor 2 in the fourth embodiment.

Figure 16:
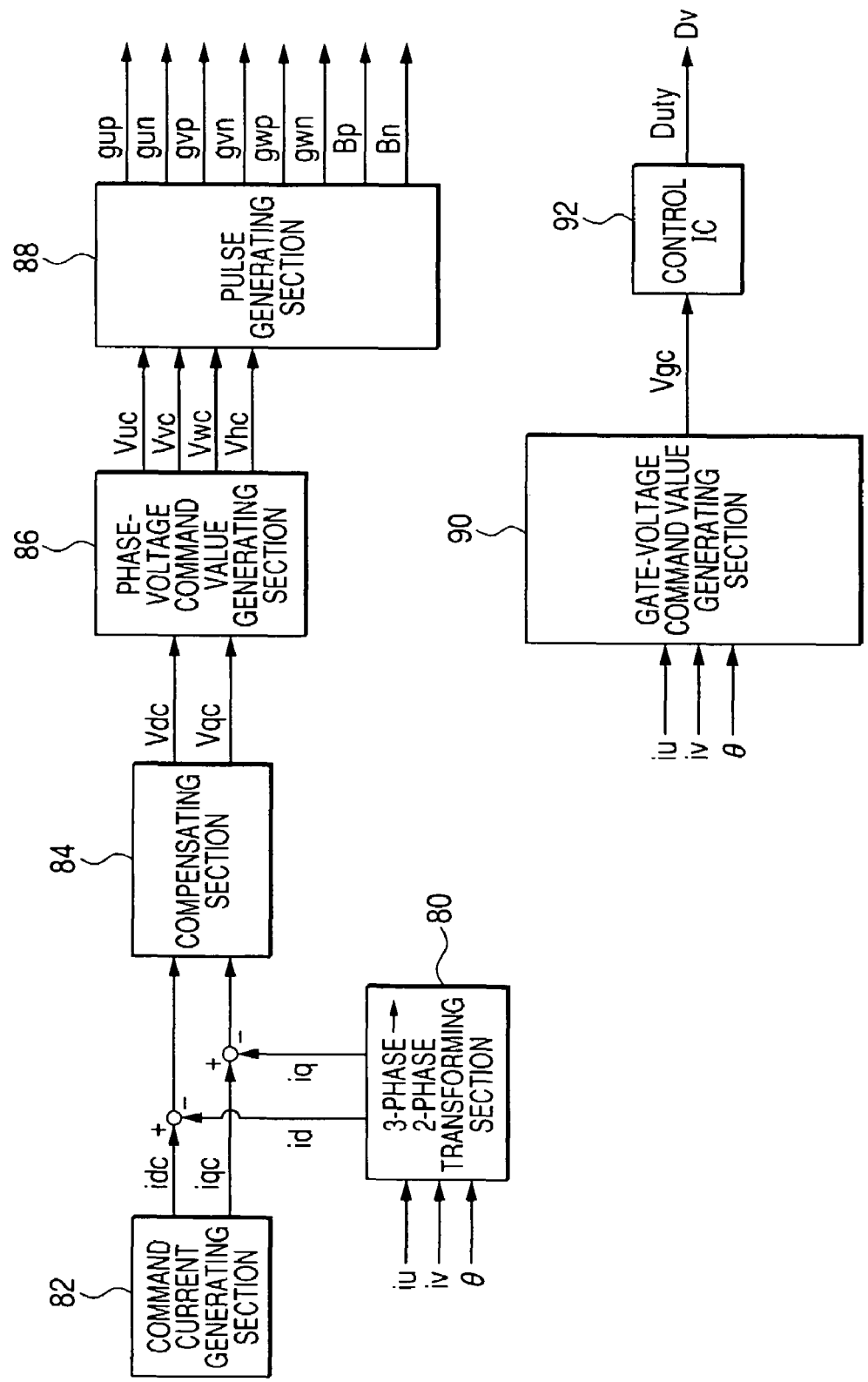
FIG. 16 is a block diagram showing a structure of an MG-ECU included in a control device according to a fourth embodiment of the invention.

FIG. 16 is a block diagram of the MG-ECU 60 of the control device of this embodiment. In FIG. 16, the reference characters identical to those in FIG. 2 designate elements equivalent to those in the first embodiment.

As shown in this figure, the gate-voltage command value generating section 90 receives the active current iu, iv as parameters having a correlation with the output torque of the motor 2, and the rotation angle θ of the motor 2 that can be used for calculating the rotational speed of the motor 2. In this embodiment, the gate-voltage command value generating section 90 is configured to variably set the gate-application voltage on the basis of the output torque of the motor 2 calculated from the active currents iu, iv, and the rotational speed of the motor 2 calculated from the rotation angle θ, while referring to the map as shown in FIG. 8 stored therein.

The fourth embodiment offers the advantages (1), (2) enumerated in the first embodiment.

Fifth Embodiment

Next, a control device according to a fourth embodiment of the invention is explained.

The fifth embodiment differs from the first embodiment in that the MG-ECU 60 is configured to recognize an area where the power loss of the inverter 10 is large on the basis of the command voltage Vuc, Vvc, Vwc, and the control signals gup, gvp, gwp of the switching elements 12-22, and to increase the gate-application voltage for the recognized area.

Figure 17:
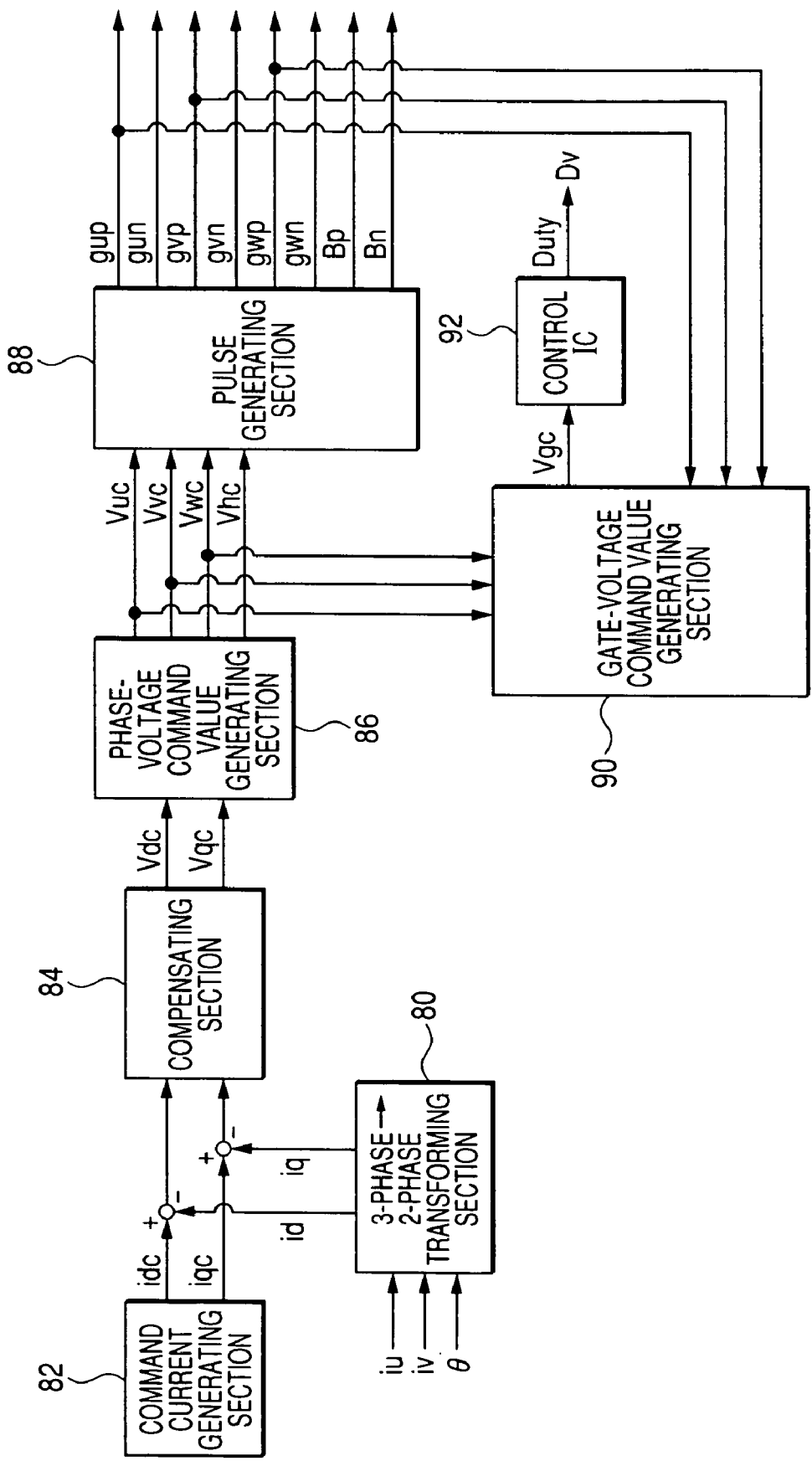
FIG. 17 is a block diagram showing a structure of an MG-ECU included in a control device according to a fifth embodiment of the invention.

FIG. 17 is a block diagram of the MG-ECU 60 of the control device of this embodiment. In FIG. 17, the reference characters identical to those in FIG. 2 designate elements equivalent to those in the first embodiment.

As shown in this figure, the gate-voltage command value generating section 90 receives the command voltages Vuc, Vvc, Vwc, and the control signals gup, gvp, gwp. The gate-voltage command value generating section 90 calculates a line-to-line voltage of the motor 2 from the command voltages Vuc, Vvc, Vwc, and determines a current flowing into the motor 2 and currents flowing through the switching elements 12-22 on the basis of the calculated line-to-line voltage. The gate-voltage command value generating section 90 also determines the switching frequency on the basis of the control signals gup, gvp, gwp.

The gate-voltage command value generating section 90 determines the power loss of the inverter 10 by calculating the conduction loss and the switching loss of the switching elements 12-22 per unit time. The conduction loss per unit time can be calculated by integrating, for a unit time, the conduction loss per one switching cycle which depends on the currents flowing through the switching elements 12-22. Alternatively, the conduction loss per unit time may be calculated as a product of an average conduction loss and the switching frequency. The switching loss per unit time can be calculated by integrating, for a unit time, the switching loss per one switching cycle which depends on the currents flowing through the switching elements 12-22. Alternatively, the switching loss per unit time may be calculated on the basis of the switching frequency and an average value of the currents flowing into the switching elements 12-22. Further alternatively, the switching loss per unit time may be roughly determined depending on the switching frequency, because the switching frequency has a correlation with the switching loss The fifth embodiment described above offers the advantage (1) enumerated in the first embodiment.

It is a matter of course that various modifications can be made to the above described embodiments as described below.

In the fourth embodiment, the command application-voltage Vgc is determined on the basis of the rotational speed of the motor 2 that can be calculated from the rotation angle θ and the active currents iu and iv. However, it may be determined from one of the active currents iu, lv, and iw, and the rotational speed of the motor 2.

The fifth embodiment may be so configured as to determine the switching frequency from the control signals gun, gvn, gwn instead of the control signals gup, gvp, gwp. Furthermore, the fifth embodiment may be so configured as to determine the switching frequency from one of these six control signals.

The way for calculating the power loss is not limited to that described in the fifth embodiment. For example, it can be calculated on the basis of the product of a detection value of either one of the current sensors 64, 66 and a detection value of the voltage sensor 42, because the product of the voltage applied across the terminals of the inverter 10 (the voltage across the terminals of the capacitor 40) and the current flowing into the motor 2 is equal to the output power of the inverter 10. Incidentally, it is possible to directly determine the gate-application voltage without calculating the power loss by referring to a map showing a relationship between one of the detection values of the current sensors 64, 66 and the detection value of the voltage sensor 42.

Since the power loss of the inverter 10 increases with the increase of the output power of the inverter 10, it is also possible to determine the power loss from one of the active currents iu, iv, iw, and corresponding one of the command voltages Vuc, Vvc, Vwc. That is because the product of one of the active currents iu, iv, iw, and corresponding one of the command voltages Vuc, Vvc, Vwc is equal to the output power per phase, and accordingly three times the calculated product can be regarded as the total output power of the inverter 10.

In the fifth embodiment, the driver circuit 70 may have a structure as shown in FIG. 10 or FIG. 14. Since the fifth embodiment has the ability to judge which of the conduction loss and the switching loss is the main cause of the power loss of the inverter 10, it is advantageous that the the drive circuit 70 in the fifth embodiment has the structure as shown in FIG. 14.

It should be noted that the structure of the drive circuit 70 is not limited to those shown in FIG. 3, FIG. 10, and FIG. 14. For example, it may have a voltage transforming circuit constituted by. charge pumps, or a bootstrap circuit.

The parameters used for variably setting the gate-application voltage are not limited to those shown in the above described embodiments. For example, they may be input signals of the compensating section 84 shown in FIG. 2. In other words, they may be the difference between the active current id and the command current idc, and the difference between the active current iq and the command current iqc.

The switching control method is not limited to that shown in FIG. 8. For example, the switching control method may be such that a PWM control is performed in an area where the rotational speed of the motor 2 is lower than a predetermined threshold, and an instantaneous current control is performed in an area where the rotational speed of the motor 2 is higher than the predetermined threshold.

The power switching element of the voltage-controlled type whose conduction state can be controlled by the application of voltage to its conduction control terminal is not limited to the IGBT. For example, as such a switching element, a MOS transistor can be advantageously used, because it has a characteristic that the conduction loss thereof reduces with the increase of the absolute value of the voltage applied to its conduction control terminal like the IGBT.

The power switching element is not limited to that which is configured to turn on when an H-level voltage is applied to a conduction control terminal thereof. For example, it may be a p-channel MOS transistor which turns on when an L-level voltage is applied to a gate thereof. Also in this case, the conduction loss can be reduced by increasing the absolute value of the negative voltage applied between the source and the gate thereof.

Although the above described embodiments are directed to a control device for controlling an inverter mounted on a hybrid vehicle, the present invention is applicable to a DC-DC converter for applying a high DC voltage to a motor mounted on a hybrid vehicle or an electric vehicle.

The above explained preferred embodiments are exemplary of the invention of the present application which is described solely by the claims appended below. It should be understood that modifications of the preferred embodiments may be made as would occur to one of skill in the art.

What is claimed is:

1. A control device for controlling a power conversion circuit including voltage-controlled type switching elements, comprising:
   a control unit generating conduction control signals for controlling conduction states of said switching elements in accordance with an external command; and
   a driver circuit applying a conduction control terminal of each of said switching elements with one of a first voltage having a value to turn on said switching elements and a second voltage having a value to turn off said switching elements in accordance with said conduction control signals;

wherein said control unit includes a first function of estimating whether or not power loss of said switching elements is larger than a certain value on the basis of sensor signals received from external sensor monitoring said power conversion circuit or an electric load supplied with electric power from said power conversion circuit, and said driver circuit is configured to change at least one of said value of said first voltage and said value of said second voltage so that a voltage difference between said first and second voltages becomes large when said first function estimates that said power loss of said switching elements is larger than said certain value.

2. The control device according to claim 1, wherein said driver circuit is configured to increase an absolute value of said first voltage when said first function estimates that said power loss of said switching elements is larger than said certain value.

3. The control device according to claim 1, wherein said control unit further includes a second function of estimating which of conduction loss and switching loss is a main cause of said power loss of said switching elements on the basis of said sensor signals, and said driver circuit is configured to increase an absolute value of said first voltage when said second function estimates that conduction loss is a main cause of said power loss, and to increase an absolute value of a difference between said first voltage and said second voltage when said second function estimates that switching loss is a main cause of said power loss.

4. The control device according to claim 1, wherein said driver circuit is configured to set signs of said first and second voltages opposite to each other.

5. The control device according to claim 1, wherein said control unit is configured to cause said driver circuit to increase an absolute value of said first voltage when output power of said power conversion circuit is larger than a certain value.

6. The control device according to claim 1, wherein said first function is configured to estimate that power loss of said switching elements is larger than said certain value when an output power of said power conversion circuit exceeds a predetermined value.

7. The control device according to claim 1, wherein said sensor signals include at least one of a signal indicative of an output current of said power conversion circuit, a signal indicative of an output voltage of said power conversion circuit, and signals designating timings to turn on or off said switching elements.

8. The control device according to claim 1, wherein said electric load is a multiphase motor and said first function is configured to estimate that power loss of said switching elements is larger than said certain value when an output power of said multiphase motor is larger than a certain value.

9. The control device according to claim 1, wherein said electric load is a multiphase motor, and said sensor signals include at least one of a signal indicative of a voltage applied to said multiphase motor, a signal indicative of a current flowing into said multiphase motor, a signal indicative of a command voltage to be applied to said multiphase motor, a signal indicative of a command current to be flown into said multiphase motor, a rotational speed of said multiphase motor, and an output torque of said multiphase motor.

10. The control device according to claim 1, wherein said electric load is a three phase motor and said control unit is configured to generate said conduction control signals for controlling conduction states of said switching elements on the basis of a difference between a dq-transformed command current and a dq-transformed active current of said three-phase motor, said sensor signal including at least one of dq-transformed currents on d- and q-axes, or a dq-transformed voltage on d- and q-axes of said three-phase motor.

11. The control device according to claim 10, wherein, said control unit includes a map defining a relationship between one of said first and second voltages and said difference.

* * * * *